(12) United States Patent
Tanaka et al.

(10) Patent No.: US 10,153,352 B2
(45) Date of Patent: Dec. 11, 2018

(54) SEMICONDUCTOR DEVICE

(71) Applicant: TOYODA GOSEI CO., LTD., Kiyosu-shi (JP)

(72) Inventors: Nariaki Tanaka, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/449,745

(22) Filed: Mar. 3, 2017

(65) Prior Publication Data
US 2017/0263725 A1 Sep. 14, 2017

(30) Foreign Application Priority Data
Mar. 10, 2016 (JP) ................. 2016-046903

(51) Int. Cl.
*H01L 29/15* (2006.01)
*H01L 29/45* (2006.01)
(Continued)

(52) U.S. Cl.
CPC ........ *H01L 29/452* (2013.01); *H01L 21/0254* (2013.01); *H01L 21/26546* (2013.01);
(Continued)

(58) Field of Classification Search
CPC ............. H01L 29/452; H01L 21/28575; H01L 21/28264; H01L 21/3245; H01L 21/26546;
(Continued)

(56) References Cited

U.S. PATENT DOCUMENTS

| 5,563,422 A | 10/1996 | Nakamura et al. |
| 5,696,396 A * | 12/1997 | Tokura ............ H01L 29/1095 257/330 |

(Continued)

FOREIGN PATENT DOCUMENTS

| JP | H07-45867 A | 2/1995 |
| JP | H09-64337 A | 3/1997 |

(Continued)

*Primary Examiner* — Vu A Vu
(74) *Attorney, Agent, or Firm* — McGinn IP Law Group, PLLC

(57) ABSTRACT

A technique of reducing the complication in manufacture is provided. There is provided a semiconductor device comprising an n-type semiconductor region made of a nitride semiconductor containing gallium; a p-type semiconductor region arranged to be adjacent to and in contact with the n-type semiconductor region and made of the nitride semiconductor; a first electrode arranged to be in ohmic contact with the n-type semiconductor region; and a second electrode arranged to be in ohmic contact with the p-type semiconductor region. The first electrode and the second electrode are mainly made of one identical metal. The identical metal is at least one metal selected from the group consisting of palladium, nickel and platinum. A concentration of a p-type impurity in the n-type semiconductor region is approximately equal to a concentration of the p-type impurity in the p-type semiconductor region. A difference between a concentration of an n-type impurity and the concentration of the p-type impurity in the n-type semiconductor region is not less than $1.0 \times 10^{19}$ cm$^{-3}$.

18 Claims, 12 Drawing Sheets

(51) Int. Cl.
  *H01L 21/02* (2006.01)
  *H01L 21/265* (2006.01)
  *H01L 21/28* (2006.01)
  *H01L 21/285* (2006.01)
  *H01L 21/324* (2006.01)
  *H01L 29/20* (2006.01)
  *H01L 29/423* (2006.01)
  *H01L 29/778* (2006.01)

(52) U.S. Cl.
  CPC .. *H01L 21/28264* (2013.01); *H01L 21/28575* (2013.01); *H01L 21/3245* (2013.01); *H01L 29/2003* (2013.01); *H01L 29/4236* (2013.01); *H01L 29/7788* (2013.01)

(58) Field of Classification Search
  CPC ............. H01L 29/7788; H01L 29/4236; H01L 29/2003; H01L 21/0254
  USPC .......................................................... 257/76
  See application file for complete search history.

(56) References Cited

U.S. PATENT DOCUMENTS

| | | | |
|---|---|---|---|
| 6,008,539 A | 12/1999 | Shibata et al. | |
| 7,960,782 B2* | 6/2011 | Otake | H01L 21/28264 257/330 |
| 7,999,286 B2* | 8/2011 | Ohta | H01L 21/28587 257/108 |
| 9,391,150 B2* | 7/2016 | Oka | H01L 29/452 |
| 2008/0296624 A1 | 12/2008 | Murayama et al. | |
| 2009/0179258 A1 | 7/2009 | Otake | |
| 2015/0034904 A1* | 2/2015 | Fujimoto | H01L 29/2003 257/20 |

FOREIGN PATENT DOCUMENTS

| | | |
|---|---|---|
| JP | 2006-313773 A | 11/2006 |
| JP | 4175157 B2 | 11/2008 |
| JP | 2008-300807 A | 12/2008 |
| JP | 2009-177110 A | 8/2009 |
| JP | 2015-028965 A | 2/2015 |

* cited by examiner

Fig.3
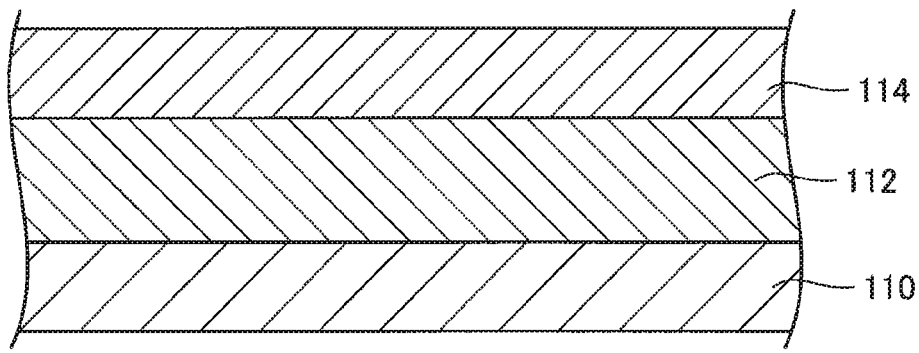
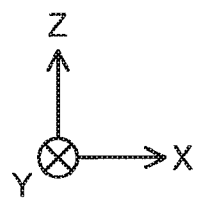
Fig.4
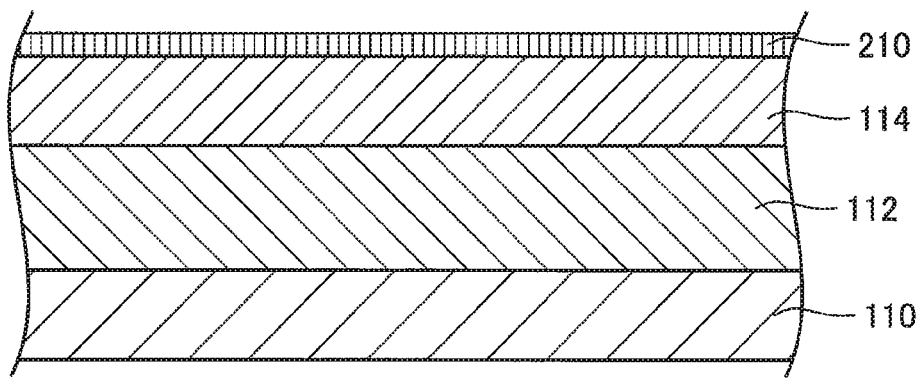
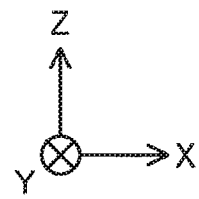

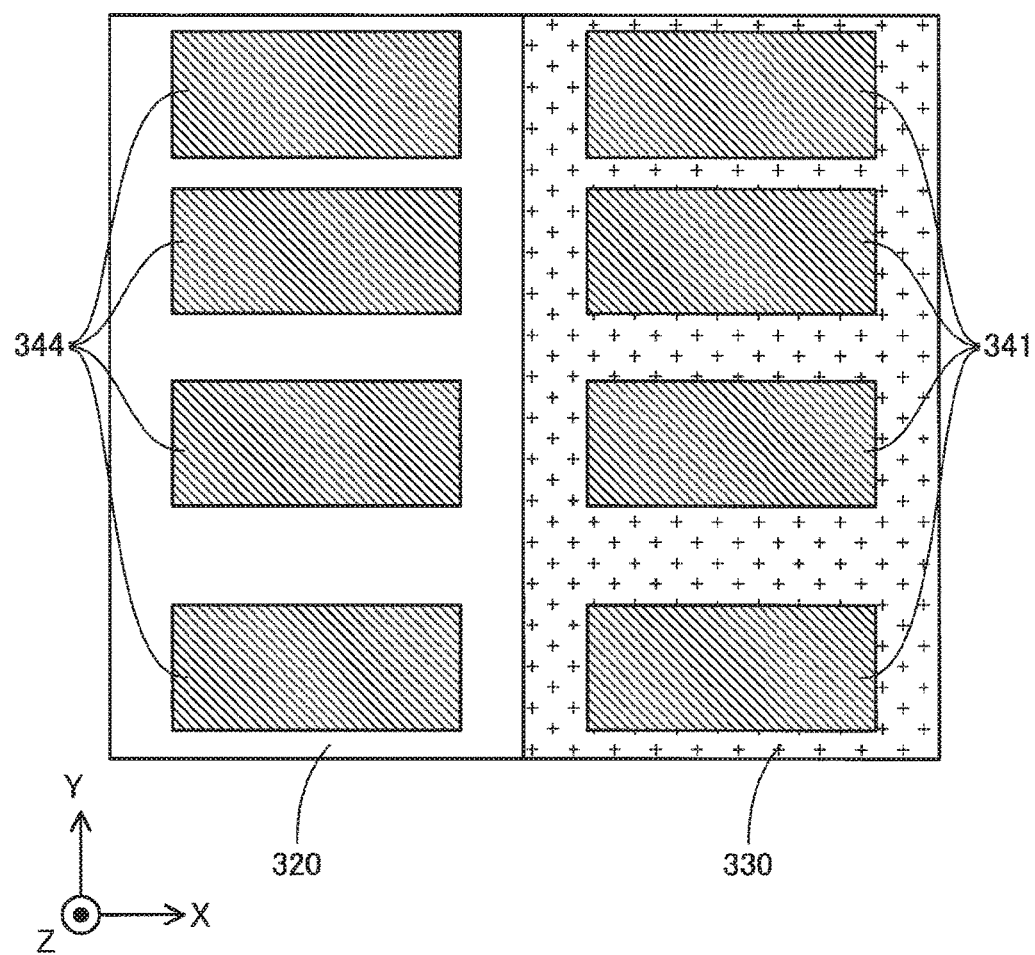

Fig.10

| | EX | | | | | | | COMP EX | |
|---|---|---|---|---|---|---|---|---|---|
| | 1 | 2 | 3 | 4 | 5 | 6 | 7 | 1 | 2 |
| Electrode | Pd=100nm | Pd=100nm | Pd=100nm | Pd=100nm | Pd=100nm | Ni=100nm | Ni=100nm | Pd=100nm | Ni=100nm |
| Concentration of Mg as p-type impurity (Na)[cm$^{-3}$] | $1.0 \times 10^{18}$ | $1.0 \times 10^{18}$ | $1.0 \times 10^{19}$ | $4.0 \times 10^{18}$ | $1.0 \times 10^{19}$ | $1.0 \times 10^{18}$ | $1.0 \times 10^{18}$ | $4.0 \times 10^{18}$ | $4.0 \times 10^{18}$ |
| Concentration of Si as n-type impurity (Nd)[cm$^{-3}$] | $6.2 \times 10^{20}$ | $2.1 \times 10^{20}$ | $1.0 \times 10^{20}$ | $3.8 \times 10^{19}$ | $2.7 \times 10^{19}$ | $6.2 \times 10^{20}$ | $2.1 \times 10^{20}$ | $1.0 \times 10^{19}$ | $1.0 \times 10^{19}$ |
| Nd−Na[cm$^{-3}$] | $6.2 \times 10^{20}$ | $2.1 \times 10^{20}$ | $9.4 \times 10^{19}$ | $3.4 \times 10^{19}$ | $1.7 \times 10^{19}$ | $6.2 \times 10^{20}$ | $2.1 \times 10^{20}$ | $6.0 \times 10^{18}$ | $6.0 \times 10^{18}$ |
| Contact resistance [Ω·cm$^2$] | $1.8 \times 10^{-5}$ | $1.9 \times 10^{-5}$ | $3.9 \times 10^{-5}$ | $1.5 \times 10^{-4}$ | $5.0 \times 10^{-4}$ | $7.7 \times 10^{-6}$ | $7.2 \times 10^{-6}$ | — | — |
| Evaluation result | A | A | A | A | B | A | A | C | C |

Fig.11

| | EX | | | | | | | | | |
|---|---|---|---|---|---|---|---|---|---|---|
| | 8 | 9 | 10 | 11 | 12 | 13 | 14 | 15 | 16 | 17 |
| Electrode | Pd=100nm | Pd=100nm | Pd=100nm | Pd=100nm | Pd=100nm | Ni=100nm | Ni=100nm | Ni=100nm | Ni=100nm | Ni=100nm |
| Heat treatment temperature [°C] | Not performed | 400 | 500 | 550 | 600 | Not performed | 400 | 500 | 550 | 600 |
| Concentration of Mg as p-type impurity (Na) [cm$^{-3}$] | $1.0 \times 10^{18}$ | $1.0 \times 10^{18}$ | $1.0 \times 10^{18}$ | $1.0 \times 10^{18}$ | $1.0 \times 10^{18}$ | $1.0 \times 10^{18}$ | $1.0 \times 10^{18}$ | $1.0 \times 10^{18}$ | $1.0 \times 10^{18}$ | $1.0 \times 10^{18}$ |
| Concentration of Si as n-type impurity (Nd) [cm$^{-3}$] | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ |
| Nd − Na [cm$^{-3}$] | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ | $2.1 \times 10^{20}$ |
| Contact resistance [Ω·cm$^2$] | $1.9 \times 10^{-5}$ | $1.5 \times 10^{-5}$ | $1.1 \times 10^{-5}$ | $1.1 \times 10^{-5}$ | $1.4 \times 10^{-5}$ | $7.2 \times 10^{-6}$ | $1.2 \times 10^{-5}$ | $9.4 \times 10^{-6}$ | $4.5 \times 10^{-6}$ | $7.9 \times 10^{-6}$ |
| Evaluation result | A | A | A | A | A | A | A | A | A | A |

SEMICONDUCTOR DEVICE

CROSS-REFERENCE TO RELATED APPLICATION

The present application claims priority from Japanese patent applications No. 2016-046903 filed on Mar. 10, 2016, the content of which is hereby incorporated by reference into this application.

BACKGROUND

Field

The disclosure relates to a semiconductor device.

Related Art

A conventionally known semiconductor device uses gallium nitride (GaN) as the material of semiconductor and includes a p-type semiconductor region containing a p-type impurity and an n-type semiconductor region containing an n-type impurity (for example, JP 2009-177110A).

In the semiconductor device described in JP 2009-177110A, a source electrode in contact with the n-type semiconductor region is made of titanium (Ti) and aluminum (Al), in order to provide the ohmic characteristics with respect to the n-type semiconductor region. A body electrode in contact with the p-type semiconductor region is made of nickel (Ni), in order to provide the ohmic characteristics with respect to the p-type semiconductor region.

In the semiconductor device described in JP 2009-177110A, the electrode in contact with the n-type semiconductor region and the electrode in contact with the p-type semiconductor region are made of different materials. In the case where the electrode in contact with the n-type semiconductor region and the electrode in contact with the p-type semiconductor region are made of different materials, there is a need to form the respective electrodes in different processes. This complicates the manufacturing process. There is accordingly a demand for a technique that allows the electrode in contact with the n-type semiconductor region and the electrode in contact with the p-type semiconductor region to be made of the same material.

SUMMARY

In order to solve at least part of the problems described above, the disclosure may be implemented by aspects or configurations described below.

(1) According to one aspect of the invention, there is provided a semiconductor device. The semiconductor device comprises: an n-type semiconductor region made of a nitride semiconductor containing gallium; a p-type semiconductor region arranged to be adjacent to and in contact with the n-type semiconductor region and made of the nitride semiconductor; a first electrode arranged to be in ohmic contact with the n-type semiconductor region; and a second electrode arranged to be in ohmic contact with the p-type semiconductor region, wherein the first electrode and the second electrode are mainly made of one identical metal, wherein the identical metal is at least one metal selected from the group consisting of palladium, nickel and platinum, a concentration of a p-type impurity in the n-type semiconductor region is approximately equal to a concentration of the p-type impurity in the p-type semiconductor region, and a difference between a concentration of an n-type impurity and the concentration of the p-type impurity in the n-type semiconductor region is not less than $1.0\times10^{19}$ $cm^{-3}$. In the semiconductor device of this aspect, the first electrode and the second electrode are mainly made of the same metal. This reduces the complication in manufacture.

(2) According to one embodiment of the semiconductor device, the first electrode and the second electrode may be provided as one identical electrode. The configuration of the semiconductor device of this aspect allows for miniaturization of the semiconductor device.

(3) According to one embodiment of the semiconductor device, the difference between the concentration of the n-type impurity and the concentration of the p-type impurity in the n-type semiconductor region may be not greater than $1.0\times10^{21}$ $cm^{-3}$. The configuration of the semiconductor device of this aspect suppresses the surface roughness of the n-type semiconductor region.

(4) According to one embodiment of the semiconductor device, the nitride semiconductor may include at least one of aluminum and indium. The configuration of the semiconductor device of this aspect does not interfere with formation of the first electrode and the second electrode from one identical metal.

(5) According to one embodiment of the semiconductor device, the concentration of the p-type impurity in the p-type semiconductor region may be not lower than $1.0\times10^{18}$ $cm^{-3}$. The configuration of the semiconductor device of this aspect provides the good ohmic contact.

(6) According to one embodiment of the semiconductor device, the difference between the concentration of the n-type impurity and the concentration of the p-type impurity in the n-type semiconductor region may be not less than $5.0\times10^{19}$ $cm^{-3}$. The configuration of the semiconductor device of this aspect provides the better ohmic contact.

(7) According to one embodiment of the semiconductor device, the difference between the concentration of the n-type impurity and the concentration of the p-type impurity in the n-type semiconductor region may be not less than $1.0\times10^{20}$ $cm^{-3}$. The configuration of the semiconductor device of this aspect provides the further better ohmic contact.

(8) According to one embodiment of the semiconductor device, the p-type impurity contained in the p-type semiconductor region may include at least one of magnesium and zinc. The configuration of the semiconductor device of this aspect also does not interfere with formation of the first electrode and the second electrode from one identical metal.

(9) According to one embodiment of the semiconductor device, the n-type impurity contained in the n-type semiconductor region may include at least one of silicon and germanium. The configuration of the semiconductor device of this aspect also does not interfere with formation of the first electrode and the second electrode from one identical metal.

(10) According to one embodiment of the semiconductor device, the concentration of the p-type impurity in the p-type semiconductor region may decrease with an increase in distance from a surface of the p-type semiconductor region adjacent to and in contact with the second electrode. The configuration of the semiconductor device of this aspect reduces the contact resistance between the p-type semiconductor region and the second electrode.

(11) According to one embodiment of the semiconductor device, a surface of the first electrode adjacent to and in contact with the n-type semiconductor region and a surface of the second electrode adjacent to and in contact with the p-type semiconductor region may be located on different planes. In the semiconductor device of this aspect, the first electrode and the second electrode are mainly made of the same metal. This reduces the complication in manufacture.

The disclosure may be implemented by any of various aspects other than the semiconductor device described above, for example, a manufacturing method of the semiconductor device and an apparatus of manufacturing the semiconductor device by this manufacturing method.

In the semiconductor device according to any one of the aspects described above, the first electrode and the second electrode are mainly made of the same metal. This reduces the complication in manufacture.

BRIEF DESCRIPTION OF DRAWINGS

FIG. 3 is a sectional view schematically illustrating the state of a substrate after crystal growth;

FIG. 4 is a sectional view schematically illustrating the state that a film is formed;

FIG. 9 is a diagram schematically illustrating the configuration of the semiconductor element viewed downward (from the +Z-axis direction side);

FIG. 10 is a table showing the results of the first evaluation test;

FIG. 11 is a table showing the results of a second evaluation test;

DESCRIPTION OF EMBODIMENTS

A. First Embodiment

A-1. Structure of Semiconductor Device

Figure 1:
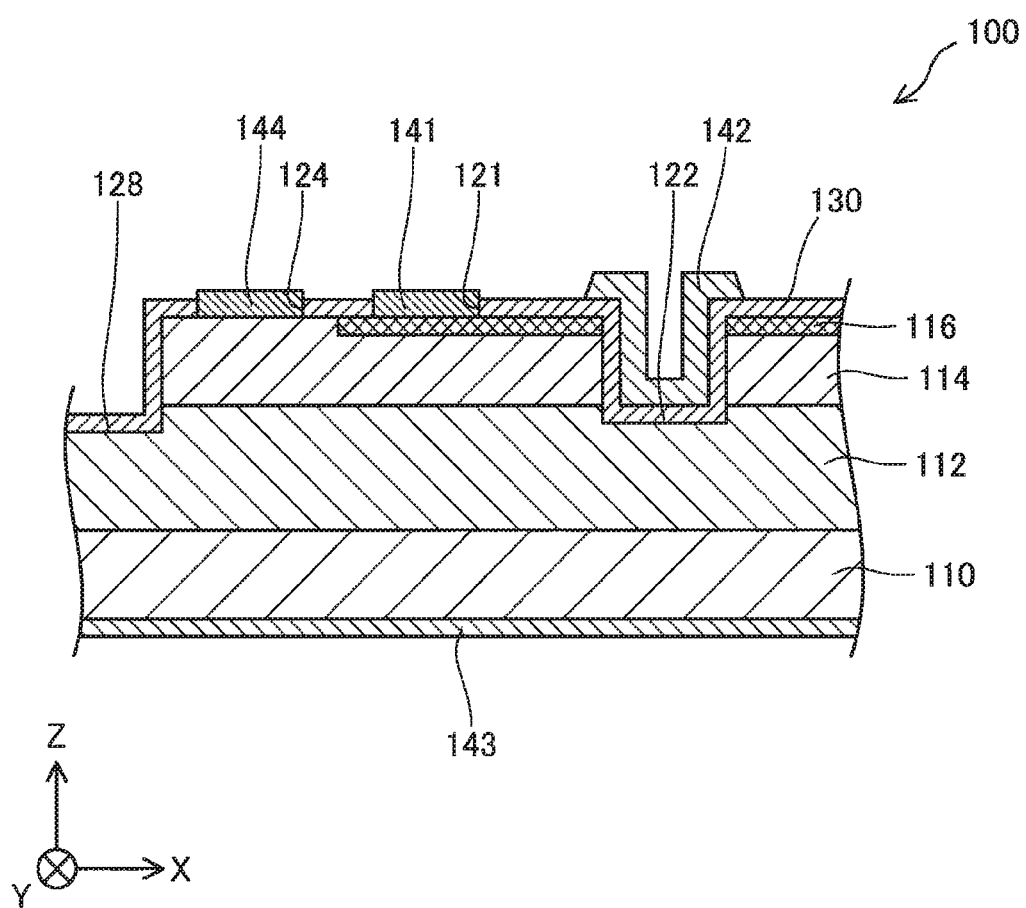
FIG. 1 is a sectional view schematically illustrating the structure of a semiconductor device according to a first embodiment.

FIG. 1 is a sectional view schematically illustrating the structure of a semiconductor device 100 according to a first embodiment. The semiconductor device 100 is a GaN-based semiconductor device formed by using gallium nitride (GaN). According to this embodiment, the semiconductor device 100 is a vertical trench MOSFET (metal-oxide-semiconductor field-effect transistor). According to this embodiment, the semiconductor device 100 is used for power control and is also called power device.

XYZ axes orthogonal to one another are illustrated in FIG. 1. Among the XYZ axes of FIG. 1, the X axis denotes a left-right axis on the sheet surface of FIG. 1. +X-axis direction denotes a rightward direction on the sheet surface, and −X-axis direction denotes a leftward direction on the sheet surface. Among the XYZ axes of FIG. 1, the Y axis denotes a front-back axis on the sheet surface of FIG. 1. +Y-axis direction denotes a backward direction on the sheet surface, and −Y-axis direction denotes a forward direction on the sheet surface. Among the XYZ axes of FIG. 1, the Z axis denotes a top-bottom axis on the sheet surface of FIG. 1. +Z-axis direction denotes an upward direction on the sheet surface, and −Z-axis direction denotes a downward direction on the sheet surface.

The semiconductor device 100 includes a substrate 110, a semiconductor layer 112, a p-type semiconductor region 114 and an n-type semiconductor region 116. The p-type semiconductor region 114 is also called semiconductor layer 114. The n-type semiconductor region 116 is also called semiconductor layer 116. The semiconductor device 100 further includes an insulating film 130, a first electrode 141, a second electrode 144, a gate electrode 142, a drain electrode 143 and trenches 122 and 128.

The substrate 110 of the semiconductor device 100 is a plate-like semiconductor extended along the X axis and the Y axis. According to this embodiment, the substrate 110 is mainly made of a nitride semiconductor containing gallium (Ga). According to this embodiment, the substrate 110 is mainly made of gallium nitride (GaN). In the description hereof, the expression of "mainly made of X" means containing X at 90% or higher molar fraction. According to this embodiment, the substrate 110 is an n-type semiconductor containing silicon (Si) as a donor element.

The semiconductor layer 112 of the semiconductor device 100 is a first semiconductor layer located on a +Z-axis direction side of the substrate 110 and is extended along the X axis and the Y axis. According to this embodiment, the semiconductor layer 112 is mainly made of gallium nitride (GaN). According to this embodiment, the semiconductor layer 112 is an n-type semiconductor containing silicon (Si) as the donor element. According to this embodiment, the semiconductor layer 112 has an average concentration of silicon (Si) of about $1 \times 10^{16}$ cm$^{-3}$. According to this embodiment, the semiconductor layer 112 is a layer formed on the substrate 110 by metal organic chemical vapor deposition (MOCVD). According to this embodiment, the semiconductor layer 112 has a thickness (length in the Z-axis direction) of about 10 μm (micrometer).

The p-type semiconductor region 114 of the semiconductor device 100 is a second semiconductor layer located on a +Z-axis direction side of the semiconductor layer 112 and is extended along the X axis and the Y axis. The p-type semiconductor region 114 is made of a nitride semiconductor containing gallium (Ga). According to this embodiment, the p-type semiconductor region 114 is mainly made of gallium nitride (GaN).

According to this embodiment, the p-type semiconductor region 114 is an area of a p-type semiconductor containing magnesium (Mg) as an acceptor element. According to this embodiment, the p-type semiconductor region 114 has an average concentration of magnesium (Mg) of $1.0 \times 10^{18}$ cm$^{-3}$. According to this embodiment, the p-type semiconductor region 114 is a layer formed on the semiconductor layer 112 by MOCVD. According to this embodiment, the p-type semiconductor region 114 has a thickness (length in the Z-axis direction) of about 1.2 μm.

The n-type semiconductor region 116 of the semiconductor device 100 is a third semiconductor layer located on part of a +Z-axis direction side of the p-type semiconductor region 114 and is extended along the X axis and the Y axis.

The n-type semiconductor region 116 is made of a nitride semiconductor containing gallium (Ga). According to this embodiment, the n-type semiconductor region 114 is mainly made of gallium nitride (GaN). According to this embodiment, the n-type semiconductor region 116 is an n-type semiconductor containing silicon (Si) as the donor element.

According to this embodiment, the n-type semiconductor region 116 is an area formed by ion implantation of silicon (Si) into the part of the +Z-axis direction side of the p-type semiconductor region 114. Accordingly, the concentration of the p-type impurity in the n-type semiconductor region 116 is substantially equal to the concentration of the p-type impurity in the p-type semiconductor region 114. The p-type semiconductor region 114 and the n-type semiconductor region 116 are adjacent to each other and are in contact with each other. In the description hereof, the expression of "substantially equal concentration" means that the difference in the concentration is within ±10 times. According to this embodiment, the n-type semiconductor region 116 has an average concentration of silicon (Si) of $2.1 \times 10^{20}$ cm$^{-3}$. According to this embodiment, the concentration substantially equal to the concentration of the p-type impurity in the n-type n-type semiconductor region 116 thus indicates the concentration of not lower than $2.1 \times 10^{19}$ cm$^{-3}$ and not higher than $2.1 \times 10^{21}$ cm$^{-3}$.

In the n-type semiconductor region 116, the difference between the concentration of the n-type impurity and the concentration of the p-type impurity is not less than $1.0 \times 10^{19}$ cm$^{-3}$.

The trench 122 of the semiconductor device 100 is a groove formed in the semiconductor layers 112, 114 and 116 and is recessed in the thickness direction (−Z-axis direction) of the semiconductor layers 112, 114 and 116. The trench 122 is made of a +Z-axis direction side of the n-type semiconductor region 116 to pass through the p-type semiconductor region 114 and the n-type semiconductor region 116 and reach the semiconductor layer 112. According to this embodiment, the trench 122 is formed by dry etching of the semiconductor layers 112, 114 and 116.

The trench 128 of the semiconductor device 100 is a groove formed in the semiconductor layers 112 and 114 and is recessed in the thickness direction (−Z-axis direction) of the semiconductor layers 112 and 114. The trench 128 is made of the +Z-axis direction side of the p-type semiconductor region 114 to pass through the p-type semiconductor region 114 and reach the semiconductor layer 112. The trench 128 is used to isolate the semiconductor device 100 from other elements formed on the substrate 110. According to this embodiment, the trench 128 is located on a −X-axis direction side of the n-type semiconductor region 116. According to this embodiment, the trench 128 is formed by dry etching of the semiconductor layers 112 and 114.

The insulating film 130 of the semiconductor device 100 is a film having electrical insulating characteristics. The insulating film 130 is made of inside over to outside of the trench 122. According to this embodiment, the insulating film 130 is formed on +Z-axis direction side surfaces of the p-type semiconductor region 114 and the n-type semiconductor region 116 and inside of the trench 128, as well as inside of the trench 122. According to this embodiment, the insulating film 130 is mainly made of silicon dioxide ($SiO_2$). According to this embodiment, the insulating film 130 is a film formed by atomic layer deposition (ALD).

The insulating film 130 includes a contact hole 121 and a contact hole 124. The contact hole 121 is a through hole formed to pass through the insulating film 130 and reach the n-type semiconductor region 116. The contact hole 124 is a through hole formed to pass through the insulating film 130 and reach the p-type semiconductor region 114. According to this embodiment, the contact holes 121 and 124 are formed by wet etching of the insulating film 130.

The first electrode 141 of the semiconductor device 100 is an electrode formed in the contact hole 121. The first electrode 141 is arranged to be in ohmic contact with the n-type semiconductor region 116. In the description hereof, ohmic contact means contact different from Schottky contact and has a relatively low contact resistance. According to this embodiment, the first electrode 141 is mainly made of palladium (Pd).

The second electrode 144 of the semiconductor device 100 is an electrode formed in the contact hole 124. The second electrode 144 is arranged to be in ohmic contact with the p-type semiconductor region 114. According to this embodiment, the second electrode 144 is mainly made of palladium (Pd) the same metal as the material metal of the first electrode 141.

The gate electrode 142 of the semiconductor device 100 is an electrode formed in the trench 122 via the insulating film 130. According to this embodiment, the gate electrode 142 is mainly made of aluminum (Al). When a voltage is applied to the gate electrode 142, an inversion layer is formed in the p-type semiconductor region 114 and serves as a channel, so as to form a conductive path between the first electrode 141 and the drain electrode 143.

The drain electrode 143 of the semiconductor device 100 is an electrode formed on a −Z-axis direction side surface of the substrate 110. The drain electrode 143 is arranged to be in ohmic contact with the substrate 110. According to the embodiment, the drain electrode 143 is an electrode formed by stacking a layer made of aluminum (Al) on a layer made of titanium (Ti) and processing the stacked layers by annealing (heat treatment).

A-2. Method of Manufacturing Semiconductor Device

Figure 2:
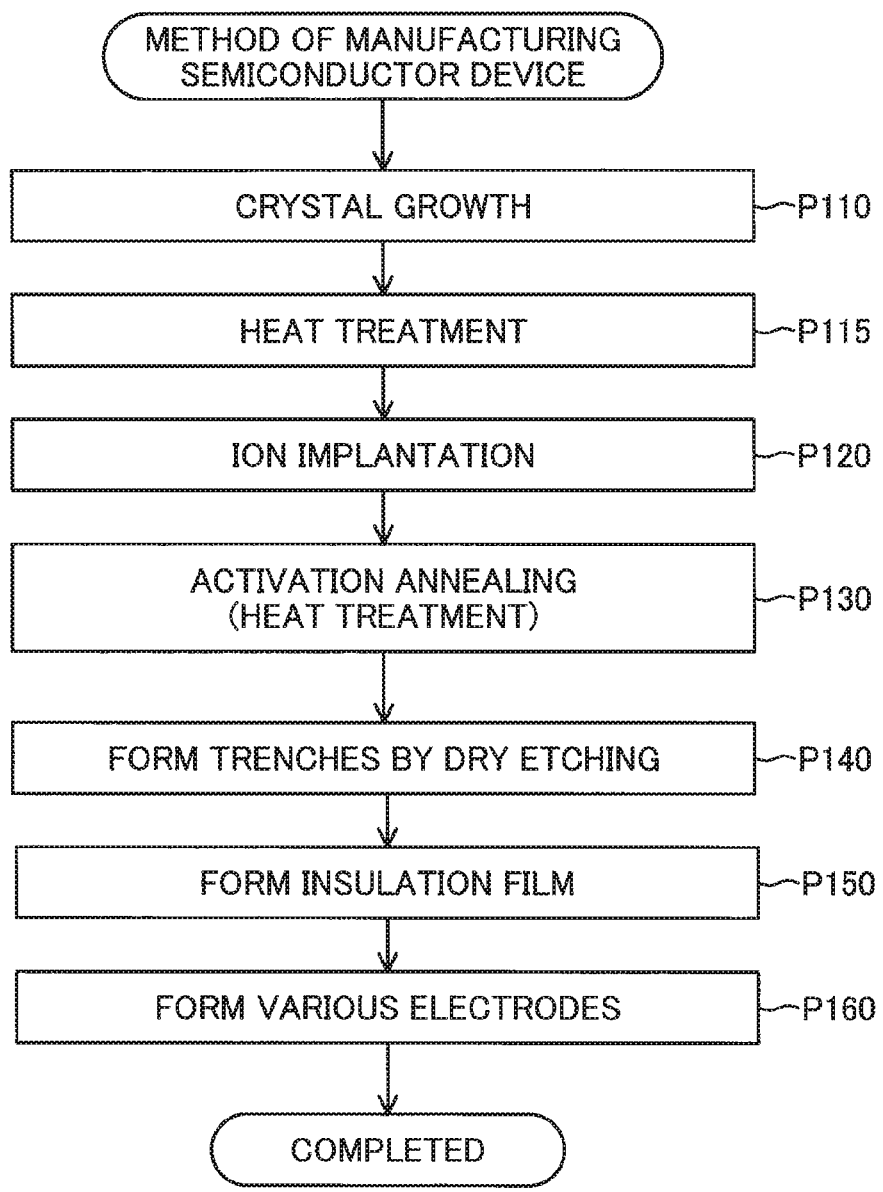
FIG. 2 is a process chart showing a method of manufacturing the semiconductor device according to the first embodiment.

FIG. 2 is a process chart showing a method of manufacturing the semiconductor device 100 according to the first embodiment. The manufacturer first provides the substrate 110. According to this embodiment, the substrate 110 is an n-type semiconductor mainly made of gallium nitride (GaN) and contains silicon (Si) as the donor element.

The manufacturer forms the semiconductor layer 112 and the semiconductor layer 114 in this sequence on the substrate 110 by crystal growth (process P110). According to this embodiment, the manufacturer forms the semiconductor layers 112 and 114 by MOCVD.

FIG. 3 is a sectional view schematically illustrating the state of the substrate 110 after crystal growth. According to this embodiment, the semiconductor layer 112 is an n-type semiconductor mainly made of gallium nitride (GaN) and contains silicon (Si) as a first donor element. According to this embodiment, the p-type semiconductor region 114 is a p-type semiconductor mainly made of gallium nitride (GaN) and contains magnesium (Mg) as an acceptor element. As shown in FIG. 3, the semiconductor layer 112 is formed on the substrate 110, and the p-type semiconductor region 114 is formed on the semiconductor layer 112. The concentration of the p-type impurity in the p-type semiconductor region 114 may be adjusted to a desired concentration by regulating the conditions of the crystal growth.

After the crystal growth (process P110 (shown in FIG. 2)), the manufacturer performs heat treatment, in order to activate magnesium (Mg) in the p-type semiconductor region 114 (process P115).

After the heat treatment (process P115), the manufacturer implants a donor element from the upper side of the p-type semiconductor region 114 by ion implantation (process P120). According to this embodiment, the manufacturer implants silicon (Si) as a second donor element into the p-type semiconductor region 114. More specifically, in the process of ion implantation, the manufacturer first forms a film 210 on the p-type semiconductor region 114.

FIG. 4 is a sectional view schematically illustrating the state that the film 210 is formed. The film 210 is used to regulate a distribution of an impurity implanted by ion implantation, in the p-type semiconductor region 114. In other words, the film 210 is used to gather the donor element implanted into the p-type semiconductor region 114, to the vicinity of the surface of the p-type semiconductor region 114. The film 210 also serves to suppress the surface of the p-type semiconductor region 114 from being damaged by ion implantation. According to this embodiment, the film 210 used is a film of silicon dioxide ($SiO_2$) having a film thickness of 30 nm. According to this embodiment, the manufacturer forms the film 210 by plasma enhanced chemical vapor deposition (CVD). The manufacturer subsequently forms a mask 220 on part of the film 210.

Figure 5:
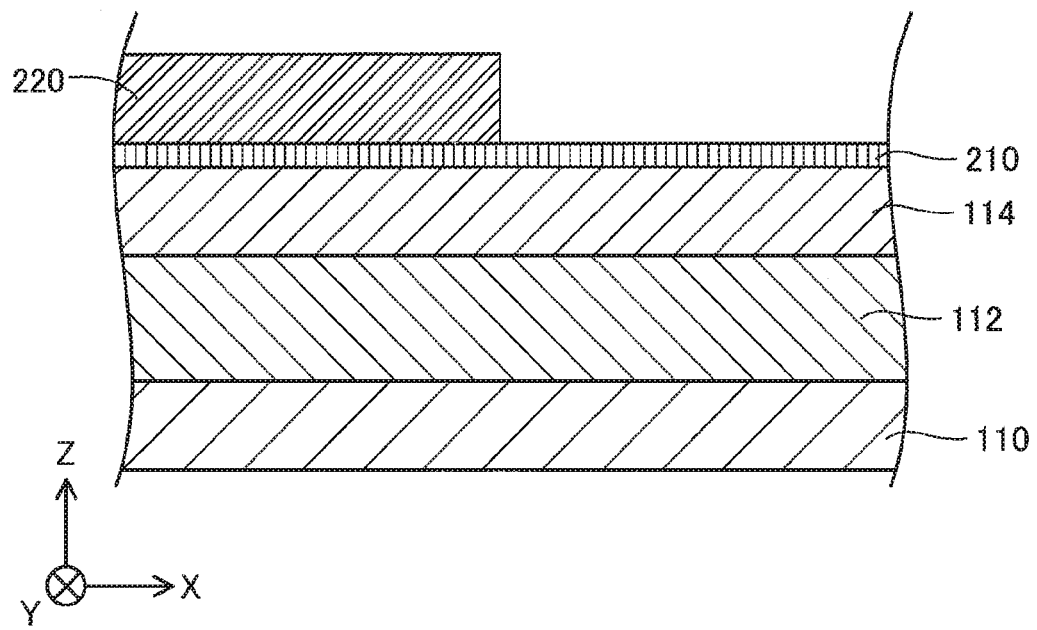
FIG. 5 is a sectional view schematically illustrating the state that a mask is formed.

FIG. 5 is a sectional view schematically illustrating the state that the mask 220 is formed. The mask 220 is formed on an area of the p-type semiconductor region 114 in which no donor element is implanted. According to this embodiment, the manufacturer forms the mask 220 by using a photoresist. According to this embodiment, the mask 220 has a film thickness of about 2 μm.

The manufacturer subsequently implants the donor element from the upper side of the p-type semiconductor region 114 by ion implantation (process P120). According to this embodiment, the manufacturer implants silicon (Si) as the donor element into the p-type semiconductor region 114. According to this embodiment, ion implantation is performed twice. The conditions of ion implantation are given below:

<Conditions of Ion Implantation>
First Time:
 accelerating voltage: 50 keV
 dose amount: $1\times10^{15}$ $cm^{-2}$; and
Second Time:
 accelerating voltage: 100 keV
 dose amount: $1\times10^{15}$ $cm^{-2}$.

Figure 6:
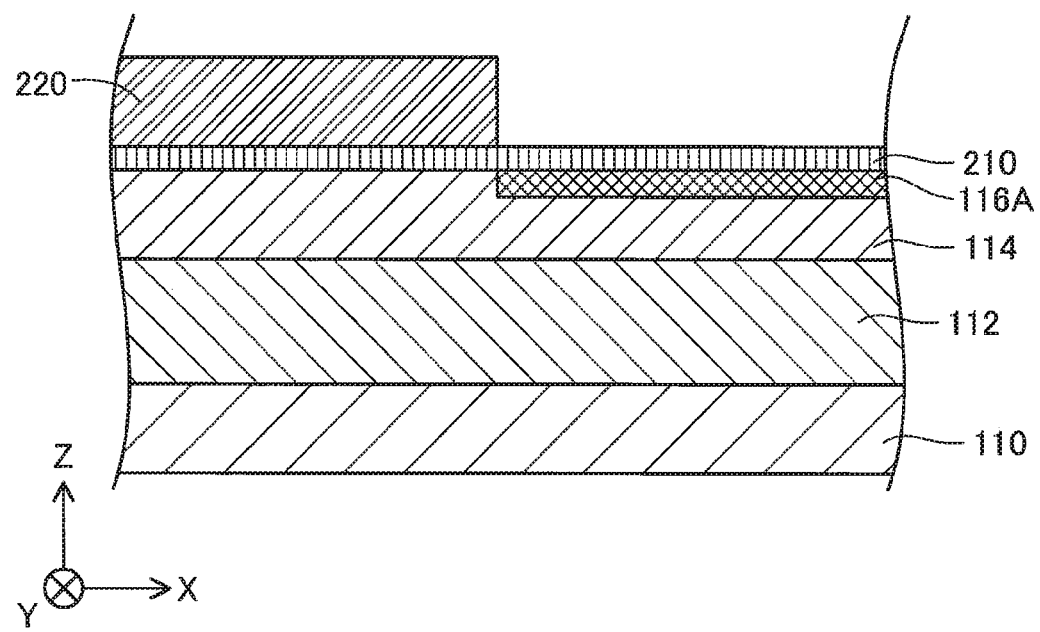
FIG. 6 is a sectional view schematically illustrating the state that ion is implanted into a p-type semiconductor region.

FIG. 6 is a sectional view schematically illustrating the state that the ion is implanted into the p-type semiconductor region 114. This ion implantation forms an ion implanted area 116A provided below the remaining part of the film 210 not covered by the mask 220 as an area in which the donor element is implanted into the p-type semiconductor region 114.

The concentration of the n-type impurity in the ion implanted area 116A may be adjusted to a desired concentration by regulating the material and the film thickness of the film 210 and regulating the accelerating voltage and the dose amount of ion implantation. The n-type impurity implanted into the ion implanted area 116A is not activated to serve as the donor element, so that the ion implanted area 116 does not have the n-type electrical conductivity. Accordingly the ion implanted area 116A is an area having a high resistance.

After implanting the donor element into the p-type semiconductor region 114, the manufacturer removes the film 210 and the mask 220 from the surface of the p-type semiconductor region 114. According to this embodiment, the manufacturer removes the mask 220 and the film 210 by wet etching. This series of operations completes the process of ion implantation (process P120 (shown in FIG. 2)).

After the ion implantation (process P120), the manufacturer performs activation annealing, in order to activate the donor element in the n-type semiconductor region 116 (process P130). In the process of activation annealing, the manufacturer heats the p-type semiconductor region 114, so as to form the n-type semiconductor region 116 having the n-type electrical conductivity on the p-type semiconductor region 114. More specifically, in the process of activation annealing, the manufacturer first forms a cap film 240 on the p-type semiconductor region 114 and the ion implanted area 116A.

Figure 7:
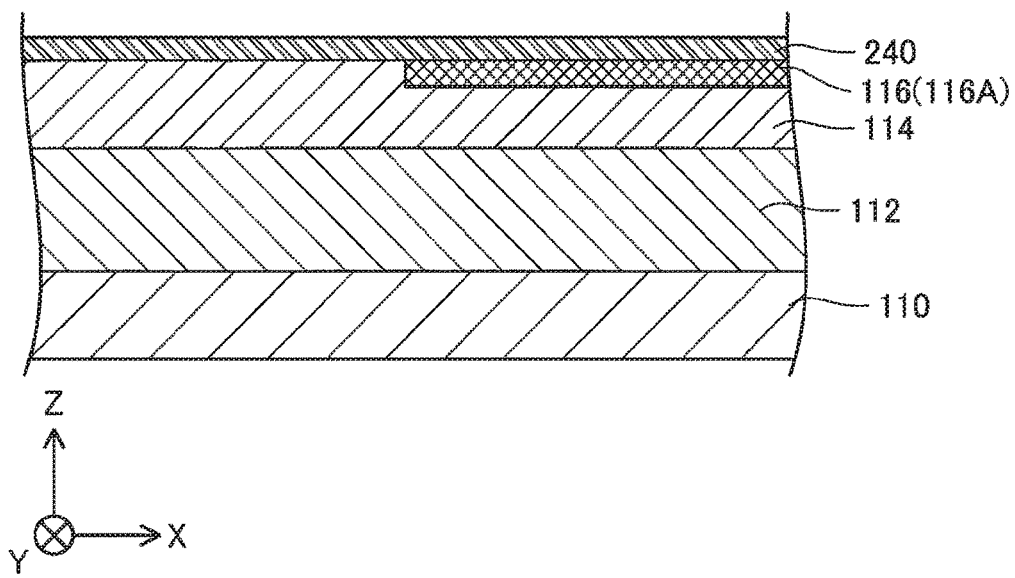
FIG. 7 is a sectional view schematically illustrating the state that a cap film is formed.

FIG. 7 is a sectional view schematically illustrating the state that the cap film 240 is formed. The cap film 240 serves to suppress the surface of the p-type semiconductor region 114 and the surface of the ion implanted area 116A from being damaged by heating. According to this embodiment, the manufacturer forms the cap film 240 by plasma CVD. According to this embodiment, the cap film 240 is mainly made of silicon nitride (SiN) and has a film thickness of about 50 nm.

The manufacturer subsequently heats the p-type semiconductor region 114 and the ion implanted area 116A. The heating temperature of the p-type semiconductor region 114 and the ion implanted area 116A is preferably not lower than 800° C. and not higher than 1250° C. According to this embodiment, the manufacturer employs the following conditions for heat treatment:

<Conditions of Heat Treatment>
 atmosphere gas: nitrogen;
 heating temperature: 1150° C.; and
 heating time: 4 minutes.

This heat treatment causes the ion implanted area 116A to form the n-type semiconductor region 116. After the heat treatment, the manufacturer removes the cap film 240 from the upper side of the p-type semiconductor region 114 and the ion implanted area 116A (n-type semiconductor region 116). According to this embodiment, the manufacturer removes the cap film 240 by wet etching. This series of operations completes the process of activation annealing (process P130 (shown in FIG. 2)).

After the activation annealing (process P130), the manufacturer forms the trenches 122 and 128 by dry etching (process P140). According to this embodiment, the manufacturer forms the trenches 122 and 128 by dry etching using a chlorine-based gas.

After forming the trenches 122 and 128 (process P140), the manufacturer forms the insulating film 130 (process P150). According to this embodiment, the manufacturer forms the insulating film 130 by ALD on the exposed surfaces of the p-type semiconductor region 114 and the n-type semiconductor region 116 that are exposed on the +Z-axis direction side.

The manufacturer subsequently forms the first electrode 141, the second electrode 144, the gate electrode 142 and the drain electrode 143 (process P160). More specifically, in the process of formation of electrodes, the manufacturer first forms the contact holes 121 and 124 (shown in FIG. 1) in the insulating film 130 by wet etching. In the process of formation of electrodes, the manufacturer subsequently forms the first electrode 141 in the contact hole 121 and forms the second electrode 144 in the contact hole 124. After forming the first electrode 141 and the second electrode 144, the manufacturer forms the gate electrode 142 via the insulating film 130 in the trench 122. After forming the gate electrode 142, the manufacturer forms the drain electrode 143 on the substrate 110. The semiconductor device 100 is completed by the above series of processes.

A-3. Advantageous Effects

In the configuration of the first embodiment, the first electrode 141 and the second electrode 144 are mainly made of the same metal. This enables the first electrode 141 and the second electrode 144 to be formed in one identical process. This reduces the complication in the manufacturing process.

When the first electrode 141 and the second electrode 144 are formed in different processes, mask formation using a photoresist is required multiple times. The embodiment, however, enables the first electrode 141 and the second electrode 144 to be formed in one identical process. This reduces the number of times of mask formation. As a result, this reduces a potential design error due to the frequency of mask formation and thereby allows for miniaturization of the semiconductor device.

In order to allow the first electrode 141 and the second electrode 144 to be mainly made of the same metal, the conditions are required to provide the ohmic contact with the n-type semiconductor region 116 and to provide the ohmic contact with the p-type semiconductor region 114. The following describes evaluation tests proving that the semiconductor device 100 of the embodiment satisfies these required conditions.

A-4. First Evaluation Test

Figure 8:
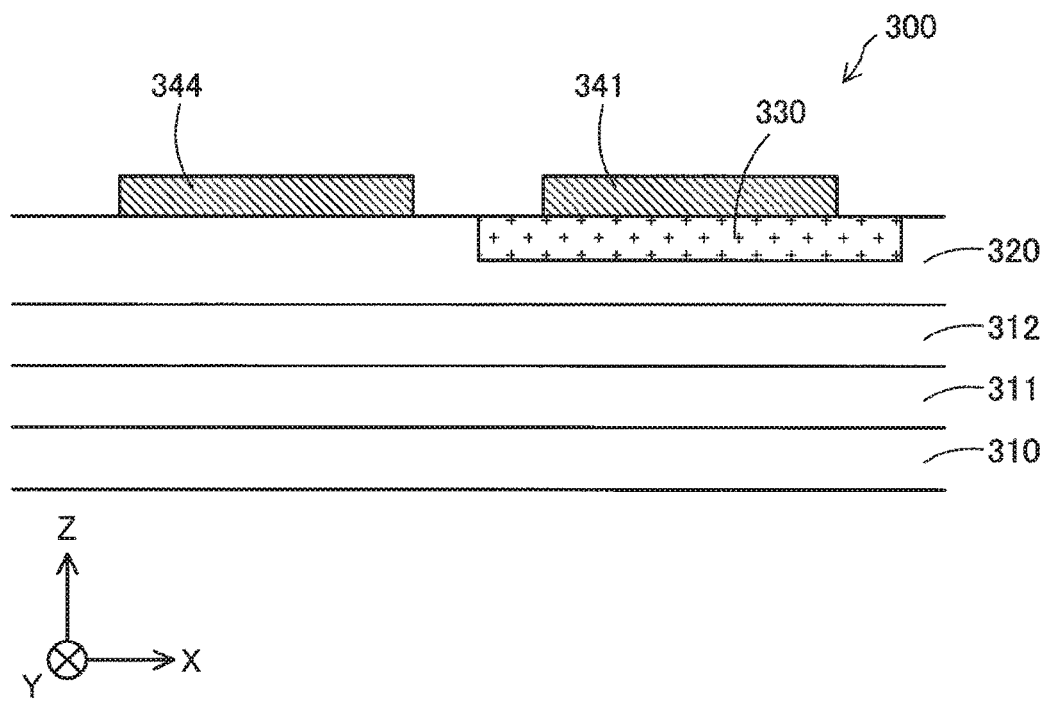
FIG. 8 is a sectional view schematically illustrating the structure of a semiconductor element that was used in a first evaluation test.

FIG. 8 is a sectional view schematically illustrating the structure of a semiconductor element 300 that was used in a first evaluation test. The XYZ axes similar to those of FIG. 1 are illustrated in FIG. 8. The semiconductor element 300 includes a substrate 310, a buffer layer 311, a semiconductor layer 312, a p-type semiconductor region 320, an n-type semiconductor region 330 and electrodes 341 and 344. The semiconductor element 300 is an element used to measure the contact resistance by a method based on a transmission line model (TLM).

The substrate 310 of the semiconductor element 300 is mainly made of sapphire. The buffer layer 311 of the semiconductor element 300 is a layer formed on the substrate 310 by MOCVD.

The semiconductor layer 312 of the semiconductor element 300 is a layer formed on the buffer layer 311 by MOCVD. The semiconductor layer 312 is an intrinsic semiconductor (i-type semiconductor) mainly made of gallium nitride (GaN).

The p-type semiconductor region 320 of the semiconductor element 300 is an area formed on the semiconductor layer 312 by MOCVD. The p-type semiconductor region 320 is a p-type semiconductor mainly made of gallium nitride (GaN) and contains magnesium (Mg) as the acceptor element. The semiconductor element 300 was processed in advanced by heat treatment, in order to activate magnesium (Mg) in the p-type semiconductor region 320.

The n-type semiconductor region 330 of the semiconductor element 300 is an area formed by ion implantation into the p-type semiconductor region 320. Accordingly, the concentration of the p-type impurity in the n-type semiconductor region 330 is equal to the concentration of the p-type impurity in the p-type semiconductor region 320. The n-type semiconductor region 330 is an area mainly made of gallium nitride (GaN). The configuration of the p-type semiconductor region 320 corresponds to the configuration of the p-type semiconductor region 114 of the semiconductor device 100. The configuration of the n-type semiconductor region 330 corresponds to the configuration of the n-type semiconductor region 116 of the semiconductor device 100.

The electrode 341 is an electrode arranged to be adjacent to and in contact with the n-type semiconductor region 330. The electrode 344 is an electrode arranged to be adjacent to and in contact with the p-type semiconductor region 320. The electrode 341 corresponds to the first electrode 141 of the semiconductor device 100. The electrode 344 corresponds to the second electrode 144 of the semiconductor device 100.

FIG. 9 is a diagram schematically illustrating the configuration of the semiconductor element 300 viewed downward (from the +Z-axis direction side). The width of the electrode 341 in the X-axis direction is identical with the width of the electrode 344 in the X-axis direction and is equal to 200 µm. Four electrodes 341 are arrayed along the Y-axis direction and are arranged at varying intervals in the Y-axis direction. The intervals of the electrodes 341 in the Y-axis direction sequentially vary as 5 µm, 10 µm and 15 µm from the +Y-axis direction side. Four electrodes 344 are arrayed and arranged similarly to the four electrodes 341. In this first evaluation test, the contact resistance was measured when electric current was made to flow between adjacent electrodes 341 and electric current was made to flow between adjacent electrodes 344.

FIG. 10 is a table showing the results of the first evaluation test. The following describes the details of the respective items in the table of FIG. 10. The item "electrode" shows the material and the thickness of the electrode 341 and the electrode 344. The item "concentration of Mg as p-type impurity (Na) [cm$^{-3}$]" denotes the concentration of magnesium (Mg) [cm$^{-3}$] the p-type impurity in the n-type semiconductor region 330. The item "concentration of Si as n-type impurity (Nd) [cm$^{-3}$]" denotes the concentration of silicon (Si) [cm$^{-3}$] the n-type impurity in the n-type semiconductor region 330. The item "Nd—Na [cm$^{-3}$]" denotes a concentration difference [cm$^{-3}$] by subtracting the concentration of Mg as p-type impurity (Na) [cm$^{-3}$] from the concentration of Si as n-type impurity (Nd) [cm$^{-3}$]. These concentrations are values measured by secondary ion mass spectrometry (SIMS). Each concentration is preferably a concentration measured in a surface adjacent to and in contact with the electrode. In analysis by secondary ion mass spectrometry, however, there is a difficulty in accurate measurement on the outermost surface. The concentration was accordingly measured at a depth of 25 nm from the outermost surface.

The item "contact resistance [Ω·cm$^2$]" denotes a measured value of contact resistance [Ω·cm$^2$] by the method based on the transfer length model (TLM). With regard to this item, the sign "-" shows that the contact resistance is extremely high and cannot be evaluated. The item "evaluation result" denotes the result of evaluation of the contact resistance as follows:

A: the case where the contact resistance is not higher than 2.0×10$^{-4}$ Ω·cm$^2$;

B: the case where the contact resistance is higher than 2.0×10$^{-4}$ Ω·cm$^2$ and not higher than 2.0×10$^{-3}$ Ω·cm$^2$; and C: the case where the contact resistance is higher than 2.0×10$^{-3}$ Ω·cm$^2$ and cannot be evaluated.

It is generally known that an electrode made of palladium (Pd) or nickel (Ni) fails to provide the ohmic characteristics with respect to n-type GaN (as described in, for example, A. C. Schmits, et al. Journal of Electric Materials, Vol. 27, No. 4, p. 255-260 (1998)). As shown by the results of Examples 1 to 7 shown in FIG. 10, however, when "Nd—Na [cm$^{-3}$]" was not less than 1.0×10$^{19}$ cm$^{-3}$, the electrode made of palladium (Pd) or nickel (Ni) provided the low contact resistance and provided the ohmic characteristics with respect to the n-type semiconductor region 330. As shown by the results of Comparative Examples 1 and 2 shown in FIG. 10, on the other hand, when "Nd—Na [cm$^{-3}$]" was smaller and was equal to 6.0×10$^{18}$ cm$^{-3}$, the electrode made of palladium (Pd) or nickel (Ni) failed to provide the ohmic characteristics with respect to the n-type semiconductor region 330.

In terms of providing the further lower contact resistance, "Nd—Na [cm$^{-3}$]" is preferably not less than 1.7×10$^{10}$ cm$^{-3}$, is more preferably not less than 3.0×10$^{10}$ cm$^{-3}$, is furthermore preferably not less than 5.0×10$^{10}$ cm$^{-3}$, and is especially preferably not less than 1.0×10$^{20}$ cm$^{-3}$. In terms of suppressing the surface roughness of the semiconductor by ion implantation, on the other hand, "Nd—Na [cm$^{-3}$]" is preferably not greater than 1.0×10$^{21}$ cm$^{-3}$ and is more preferably not greater than 4.0×10$^{20}$ cm$^{-3}$. The "concentration of Mg as p-type impurity (Na) [cm$^{-3}$]" is preferably not lower than 1.0×10$^{18}$ cm$^{-3}$.

A-5. Second Evaluation Test

In a second evaluation test, the examiner evaluated the relationship of the contact resistance to execution or non-execution of heat treatment and the heat treatment temperature using the samples of Example 2 and Example 7 of the first evaluation test.

FIG. 11 is a table showing the results of the second evaluation test. In the table of FIG. 11, the item "heat treatment temperature [° C.]" denotes the temperature of heat treatment, and the other items have the same meanings as those of FIG. 10. With respect to the item "heat treatment temperature [° C.]", "not performed" means that heat treatment was not performed. The heat treatment conditions were 5 minutes under a nitrogen atmosphere. The results of Example 8 in FIG. 11 are equivalent to the results of Example 2 in FIG. 10. The results of Example 13 in FIG. 11 are equivalent to the results of Example 7 in FIG. 10.

As shown by the results of FIG. 11, the contact resistance was not significantly varied by execution or non-execution of heat treatment or by the difference of the heat treatment temperature. More specifically, as shown by the results of FIG. 11, the semiconductor device had high thermal stability when "Nd—Na [cm$^{-3}$]" was not less than 1.0×10$^{10}$ cm$^{-3}$. As shown by the results of FIG. 11, whether heat treatment was performed or not performed after formation of the electrode caused no significant difference.

A-6. Third Evaluation Test

In a third evaluation test, the examiner used other metals for an electrode, in place of palladium (Pd) or nickel (Ni) used for the electrode of the first evaluation test, and evaluated whether the electrode made of the other metals provided the ohmic characteristics with respect to the p-type semiconductor region 320.

Figure 12:
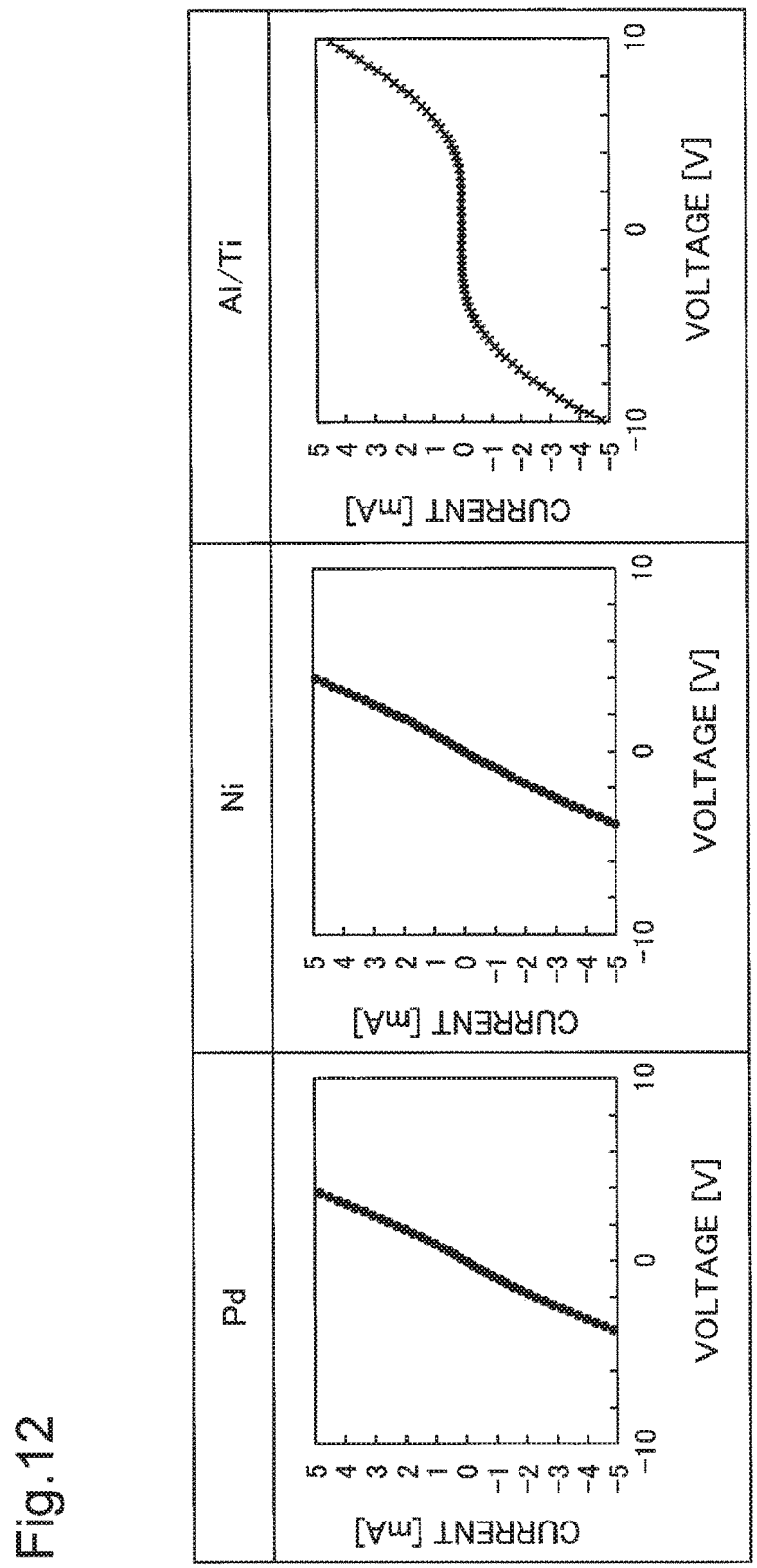
FIG. 12 is graphs showing the results of a third evaluation test.

FIG. 12 is graphs showing the results of the third evaluation test. In this third evaluation test, the examiner evaluated the ohmic characteristics, based on the IV characteristic. An electrode produced by sequentially stacking a titanium (Ti) layer (thickness of 30 nm) and an aluminum (Al) layer (thickness of 300 nm) from the side adjacent to and in contact with the semiconductor (called "comparison electrode") was used, in place of the palladium (Pd) electrode or the nickel (Ni) electrode.

In FIG. 12, the lowermost graph shows the results (i) when palladium (Pd) was used for the electrode; the middle graph shows the results (ii) when nickel (Ni) was used for the electrode; and the uppermost graph shows the results (iii) when the comparison electrode was used. In the graphs of FIG. 12, the ordinate axis shows the electric current [mA] and the abscissa axis shows the voltage [V].

As shown by the results of FIG. 12, the electrode made of palladium (Pd) or nickel (Ni) provided the ohmic characteristics with respect to the semiconductor. In the case of the comparison electrode, on the other hand, no electric current was made to flow until application of a voltage of not less than ±5 V. The comparison electrode failed to provide the ohmic characteristics with respect to the semiconductor. In other words, the electrode made of palladium (Pd) or nickel (Ni) provided the ohmic characteristics with respect to p-type GaN, while the comparison electrode failed to provide the ohmic characteristics with respect to p-type GaN.

B. Second Embodiment

Figure 13:
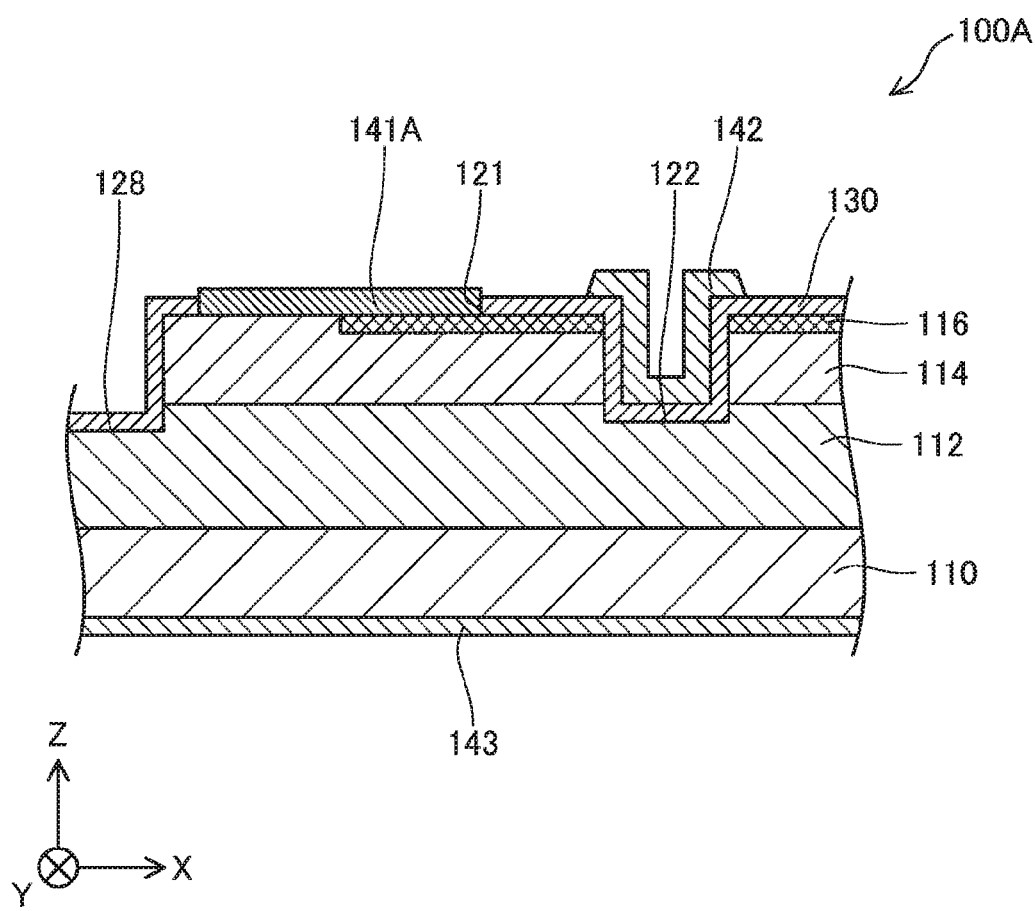
FIG. 13 is a sectional view schematically illustrating the structure of a semiconductor device according to a second embodiment.

FIG. 13 is a sectional view schematically illustrating the structure of a semiconductor device 100A according to a second embodiment. The semiconductor device 100A of the second embodiment differs from the semiconductor device 100 of the first embodiment by that the first electrode 141 and the second electrode 144 are provided as one identical electrode 141A, but is otherwise similar to the semiconductor device 100 of the first embodiment. The semiconductor device 100A includes the electrode 141A that provides the functions of the first electrode 141 and the second electrode 144 of the first embodiment and is formed by continuously connecting the first electrode 141 with the second electrode 144 of the first embodiment. This configuration allows for miniaturization of the semiconductor device 100A. The configuration of the first embodiment requires to take account of the critical dimensions of patterning using a photoresist, in order to prevent the first electrode 141 and the second electrode 144 from coming into contact with each other. The configuration of the second embodiment, on the other hand, does not require such consideration.

C. Third Embodiment

Figure 14:
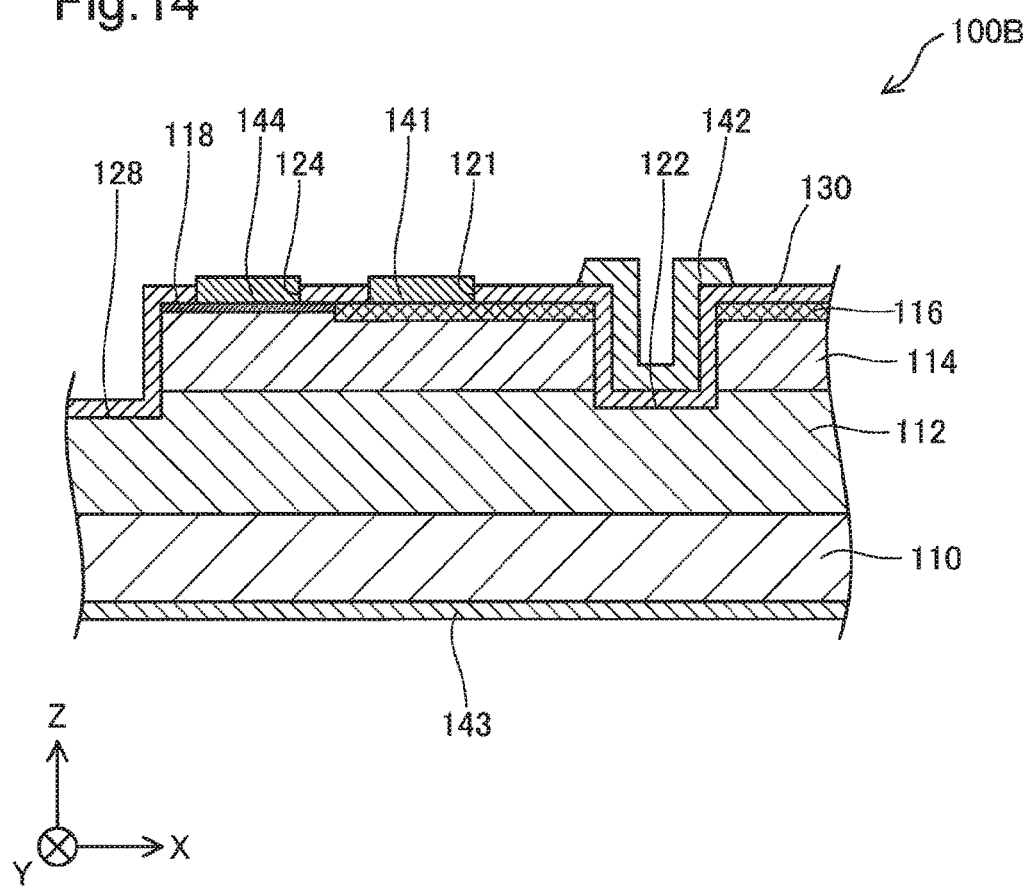
FIG. 14 is a sectional view schematically illustrating the structure of a semiconductor device according to a third embodiment.

FIG. 14 is a sectional view schematically illustrating the structure of a semiconductor device 100B according to a third embodiment. The semiconductor device 100B of the third embodiment differs from the semiconductor device 100 of the first embodiment by that a p-type semiconductor region 118 is provided between the p-type semiconductor region 114 and the second electrode 144, but is otherwise similar to the semiconductor device 100 of the first embodiment. According to this embodiment, the p-type semiconductor region 118 is provided as a layer having a higher concentration of magnesium (Mg) as the p-type impurity than that of the p-type semiconductor region 114. According to this embodiment, the concentration of the p-type impurity in the p-type semiconductor region decreases with an increase in distance from the surface of the p-type semiconductor region adjacent to and in contact with the second electrode 144. This configuration reduces the contact resistance between the p-type semiconductor region 118 and the second electrode 144. In the semiconductor device 100B of the third embodiment, the first electrode 141 and the second electrode 144 are formed as different electrodes. The first electrode 141 and the second electrode 144 may, however, be provided as one identical electrode.

D. Other Embodiments

The disclosure is not limited to any of the embodiments, the examples and the modifications described above but may be implemented by a diversity of other configurations without departing from the scope of the disclosure. For example, the technical features of any of the embodiments, the examples and the modifications corresponding to the technical features of each of the aspects described in SUMMARY may be replaced or combined appropriately, in order to solve part or all of the problems described above or in order to achieve part or all of the advantageous effects described above. Any of the technical features may be omitted appropriately unless the technical feature is described as essential herein.

In the above embodiment, the surface of the second electrode 144 adjacent to and in contact with the p-type semiconductor region 114 is flush with the surface of the first electrode 141 adjacent to and in contact with the n-type semiconductor region 116. The present disclosure is, however, not limited to this configuration. The surface of the second electrode 144 adjacent to and in contact with the p-type semiconductor region 114 and the surface of the first electrode 141 adjacent to and in contact with the n-type semiconductor region 116 may not be flush with each other but may be located on different planes.

Figure 15:
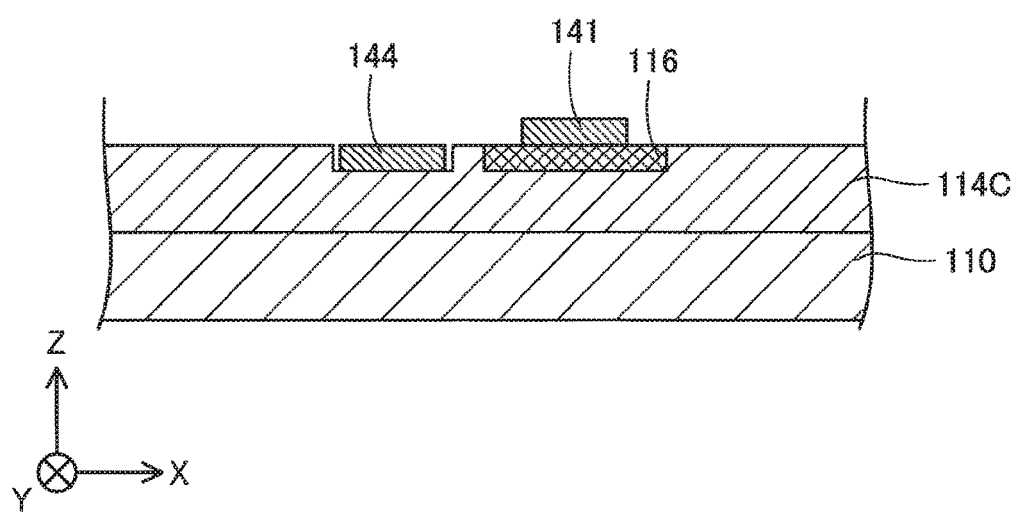
FIG. 15 is a diagram illustrating a modification.
Figure 16:
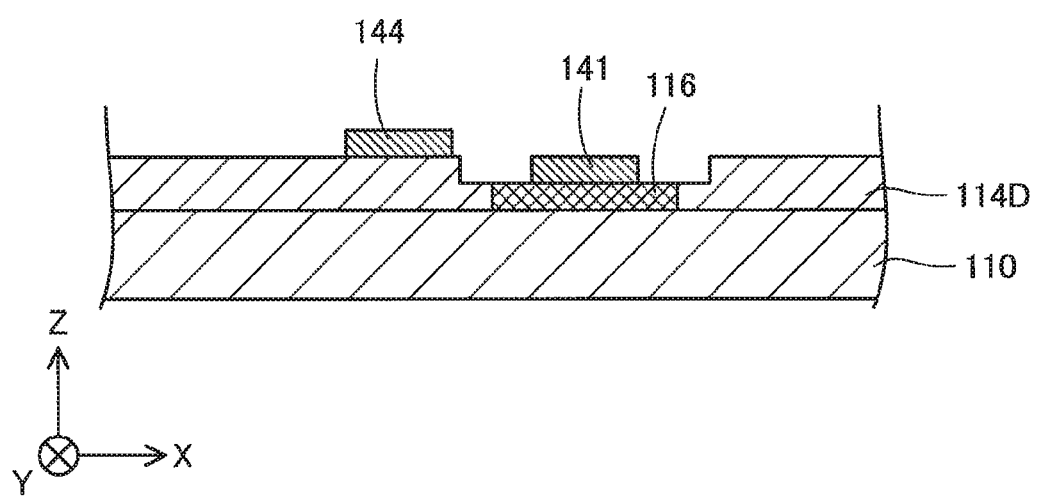
FIG. 16 is a diagram illustrating another modification.

FIGS. 15 and 16 are diagrams illustrating modifications, in which the surface of the second electrode 144 adjacent to and in contact with the p-type semiconductor region 114 and the surface of the first electrode 141 adjacent to and in contact with the n-type semiconductor region 116 are not flush with each other. In the modified configuration of FIG. 15, the surface of the second electrode 144 adjacent to and in contact with a p-type semiconductor region 114C is located below (on the −Z-axis direction side of) the surface of the first electrode 141 adjacent to and in contact with the n-type semiconductor region 116. In the modified configuration of FIG. 16, the surface of the first electrode 141 adjacent to and in contact with the n-type semiconductor region 116 is located below (on the −Z-axis direction side of) the surface of the second electrode 144 adjacent to and in contact with a p-type semiconductor region 114D. In the modified configuration of FIG. 16, the substrate 110 is provided below the n-type semiconductor region 116. According to a further modification, the p-type semiconductor region 114D may be provided between the n-type semiconductor region 116 and the substrate 110 in the Z0 axis direction.

The semiconductor device to which the present disclosure is applied is not limited to the vertical trench MOSFET described in the above embodiments but may be, for example, a pn junction diode or an insulated gate bipolar transistor (IGBT).

In the above embodiments, the first electrode 141 and the second electrode 144 are mainly made of palladium (Pd). The present disclosure is, however, not limited to these embodiments. Nickel (Ni) or platinum (Pt) may be used in place of palladium (Pd). These elements are all group 10 elements and have similar physicochemical properties. The work function of palladium (Pd) is 5.12 eV, the work function of nickel (Ni) is 5.15 eV, and the work function of platinum (Pt) is 5.65 eV. Accordingly these elements have the work functions of not lower than 5.1 eV and have similar characteristics with respect to the work function.

In the above embodiments, the material of the substrate is not limited to gallium nitride (GaN) but may be, for example, aluminum gallium nitride (AlGaN), indium gallium nitride (InGaN) or aluminum gallium indium nitride (AlGaInN). The mixing ratio of aluminum, gallium and indium is not specifically limited.

In the above embodiments, magnesium (Mg) is used as the acceptor element contained in the p-type semiconductor region 114. For example, zinc (Zn) may be used as the acceptor element.

In the above embodiments, silicon (Si) is used as the donor element contained in the n-type semiconductor region 116. For example, germanium Ge) may be used as the donor element.

In the above embodiment, the number of times of ion implantation may be once, may be twice or may be three times or more. The conditions of ion implantation (for example, the accelerating voltage and the dose amount) may be adjusted appropriately. The thickness of the film 210 may be changed as needed according to the conditions of ion implantation. The material of the film 210 is not limited to silicon dioxide ($SiO_2$) but may be, for example, silicon nitride (SiN), silicon oxynitride (SiON) or aluminum oxide ($Al_2O_3$).

In the above embodiments, the material of the insulating film may be any material having electrical insulating characteristics. The material of the insulating film other than silicon dioxide ($SiO_2$) may be, for example, at least one of silicon nitrides (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON). The insulating film may be a single layer structure or may be a two layer or more layer structure. The technique employed to form the insulating film is not limited to ALD but may be, for example, ECR sputtering or ECR-CVD.

What is claimed is:

1. A semiconductor device, comprising:
   an n-type semiconductor region made of a nitride semiconductor containing gallium;
   a p-type semiconductor region arranged to be adjacent to and in contact with the n-type semiconductor region and made of the nitride semiconductor; and
   an electrode including a first end formed on the n-type semiconductor region, and a second end opposite the first end and formed on the p-type semiconductor region, the electrode comprising:
      a first electrode including the first end and arranged to be in ohmic contact with the n-type semiconductor region; and
      a second electrode including the second end and arranged to be in ohmic contact with the p-type semiconductor region, wherein
   the first electrode and the second electrode are mainly made of one identical metal,
   the identical metal is at least one metal selected from the group consisting of palladium, nickel and platinum,
   a concentration of a p-type impurity in the n-type semiconductor region is approximately equal to a concentration of the p-type impurity in the p-type semiconductor region, and
   a difference between a concentration of an n-type impurity and the concentration of the p-type impurity in the n-type semiconductor region is not less than $1.0 \times 10^{19}$ cm$^{-3}$.

2. The semiconductor device according to claim 1, wherein the difference between the concentration of the n-type impurity and the concentration of the p-type impurity in the n-type semiconductor region is not greater than $1.0 \times 10^{21}$ cm$^{-3}$.

3. The semiconductor device according to claim 1, wherein the nitride semiconductor includes at least one of aluminum and indium.

4. The semiconductor device according to claim 1,
wherein the concentration of the p-type impurity in the p-type semiconductor region is not lower than $1.0 \times 10^{18}$ cm$^{-3}$.

5. The semiconductor device according to claim 1,
wherein the p-type impurity contained in the p-type semiconductor region includes at least one of magnesium and zinc.

6. The semiconductor device according to claim 1,
wherein the n-type impurity contained in the n-type semiconductor region includes at least one of silicon and germanium.

7. The semiconductor device according to claim 1,
wherein a surface of the first electrode adjacent to and in contact with the n-type semiconductor region and a surface of the second electrode adjacent to and in contact with the p-type semiconductor region are located on different planes.

8. The semiconductor device according to claim 1, wherein an interface between the first electrode and the n-type semiconductor region is substantially coplanar with an interface between the second electrode and the p-type semiconductor region.

9. The semiconductor device according to claim 1, further comprising:
an insulating film formed on the n-type semiconductor region, the first electrode contacting the n-type semiconductor region through the insulating film and the second electrode contacting the p-type semiconductor region through the insulating film.

10. The semiconductor device according to claim 9, further comprising:
a trench formed in the n-type semiconductor region and the p-type semiconductor region, the insulating film being formed in the trench; and
a gate electrode formed in the trench on the insulating film.

11. The semiconductor device according to claim 10, further comprising:
a semiconductor layer, the p-type semiconductor region being formed on a surface of the semiconductor layer and a bottom of the trench being formed in the semiconductor layer.

12. The semiconductor device according to claim 11, wherein an edge of the n-type semiconductor region is formed between the first and second electrodes.

13. The semiconductor device according to claim 12, wherein the p-type semiconductor region comprises a stepped portion, the edge of the n-type semiconductor region contacting a side of the stepped portion and the second electrode contacting an upper surface of the stepped portion.

14. The semiconductor device according to claim 13, wherein a width of the first electrode is substantially the same as a width of the second electrode, and
wherein the first electrode is formed between the gate electrode and the second electrode in a width direction.

15. The semiconductor device according to claim 1, wherein a thickness of the first electrode is substantially the same as a thickness of the second electrode, and the thickness of each of the first and second electrodes is greater than a thickness of the insulating film.

16. A semiconductor device, comprising:
an n-type semiconductor region made of a nitride semiconductor containing gallium;
a p-type semiconductor region arranged to be adjacent to and in contact with the n-type semiconductor region and made of the nitride semiconductor;
a first electrode arranged to be in ohmic contact with the n-type semiconductor region; and
a second electrode arranged to be in ohmic contact with the p-type semiconductor region, wherein
the first electrode and the second electrode are mainly made of one identical metal, wherein
the identical metal is at least one metal selected from the group consisting of palladium, nickel and platinum,
a concentration of a p-type impurity in the n-type semiconductor region is approximately equal to a concentration of the p-type impurity in the p-type semiconductor region, and
a difference between a concentration of an n-type impurity and the concentration of the p-type impurity in the n-type semiconductor region is not less than $1.0 \times 10^{20}$ cm$^{-3}$.

17. A semiconductor device, comprising:
an n-type semiconductor region made of a nitride semiconductor containing gallium;
a p-type semiconductor region arranged to be adjacent to and in contact with the n-type semiconductor region and made of the nitride semiconductor;
a first electrode arranged to be in ohmic contact with the n-type semiconductor region; and
a second electrode arranged to be in ohmic contact with the p-type semiconductor region, wherein
the first electrode and the second electrode are mainly made of one identical metal, wherein
the identical metal is at least one metal selected from the group consisting of palladium, nickel and platinum,
a concentration of a p-type impurity in the n-type semiconductor region is approximately equal to a concentration of the p-type impurity in the p-type semiconductor region, and
a difference between a concentration of an n-type impurity and the concentration of the p-type impurity in the n-type semiconductor region is not less than $1.0 \times 10^{19}$ cm$^{-3}$,
wherein the concentration of the p-type impurity in the p-type semiconductor region decreases with an increase in distance from a surface of the p-type semiconductor region adjacent to and in contact with the second electrode.

18. A semiconductor device, comprising:
a p-type semiconductor region;
an n-type semiconductor region formed on a surface of the p-type semiconductor region, a concentration of p-type impurity in the n-type semiconductor region being approximately equal to a concentration of p-type impurity in the p-type semiconductor region, and a difference between a concentration of an n-type impurity and the concentration of the p-type impurity in the n-type semiconductor region being not less than $1.0 \times 10^{19}$ cm$^{-3}$; and
an electrode including a first end formed on the n-type semiconductor region, and a second end opposite the first end and formed on the p-type semiconductor region, the electrode comprising:
a first electrode including the first end and contacting the n-type semiconductor region; and
a second electrode including the second end and contacting the p-type semiconductor region, the second electrode comprising the same metal as the first electrode, the metal comprising at least one member selected from the group consisting of palladium, nickel and platinum.

* * * * *